United States Patent [19]
Larson et al.

[11] Patent Number: 4,996,500
[45] Date of Patent: Feb. 26, 1991

[54] AUTOMATIC CONTROL SYSTEM

[75] Inventors: Ronald K. Larson, Mountain View; John L. Imperato, Palo Alto, both of Calif.

[73] Assignee: Hewlett-Packard Company, Palo Alto, Calif.

[21] Appl. No.: 426,637

[22] Filed: Oct. 24, 1989

[51] Int. Cl.$^5$ .............................................. H03G 3/30
[52] U.S. Cl. .................................. 330/279; 330/137; 330/284; 455/116; 455/126
[58] Field of Search ...................... 330/279, 284, 137; 455/116, 117, 126

[56] References Cited
U.S. PATENT DOCUMENTS
4,263,560  4/1981  Ricker .............................. 330/279 X Primary Examiner—James B. Mullins

[57] ABSTRACT

An automatic power control system compensates for temperature variable components in a broadband signal generator by providing a reference signal generating circuit that is temperature matched with an automatic level control feedback circuit. The temperature matched components are either monolithic or placed in substantial thermal contact with one another. The signals from the matched signal paths are input to a summing circuit such that the effect of any temperature variation in one path is exactly offset by the corresponding temperature variation in the other path.

9 Claims, 3 Drawing Sheets

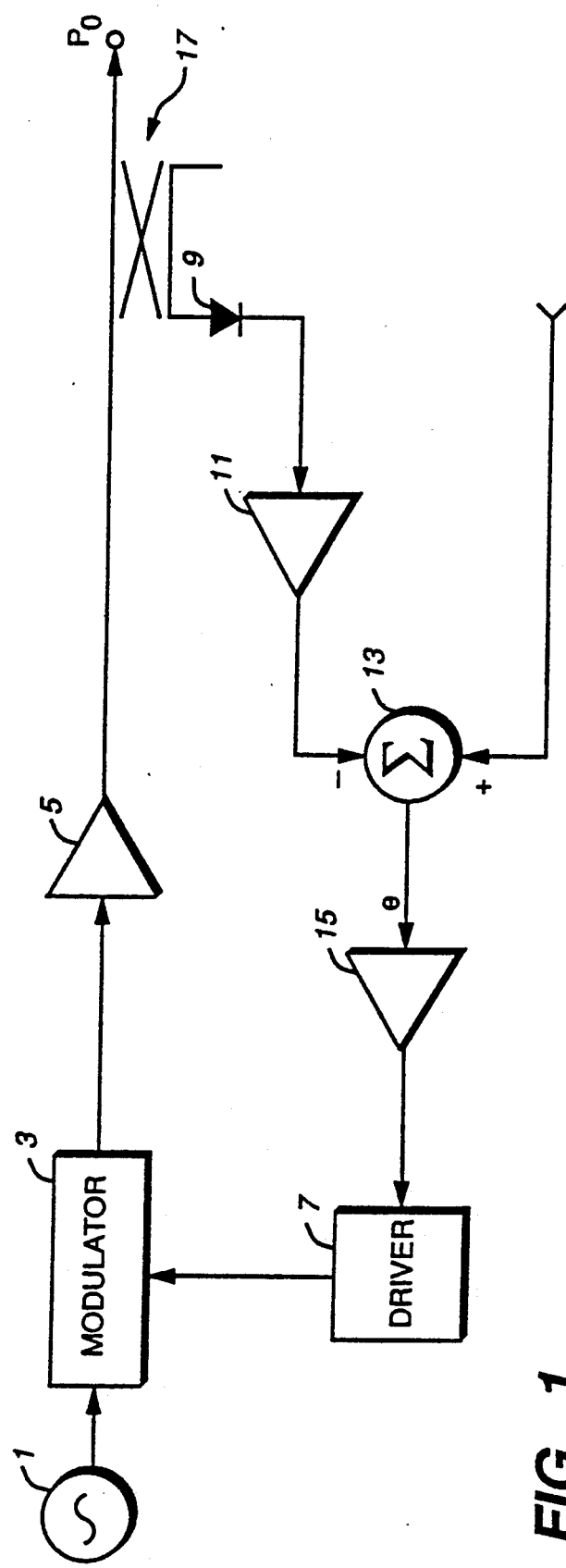
FIG._1
(PRIOR ART)

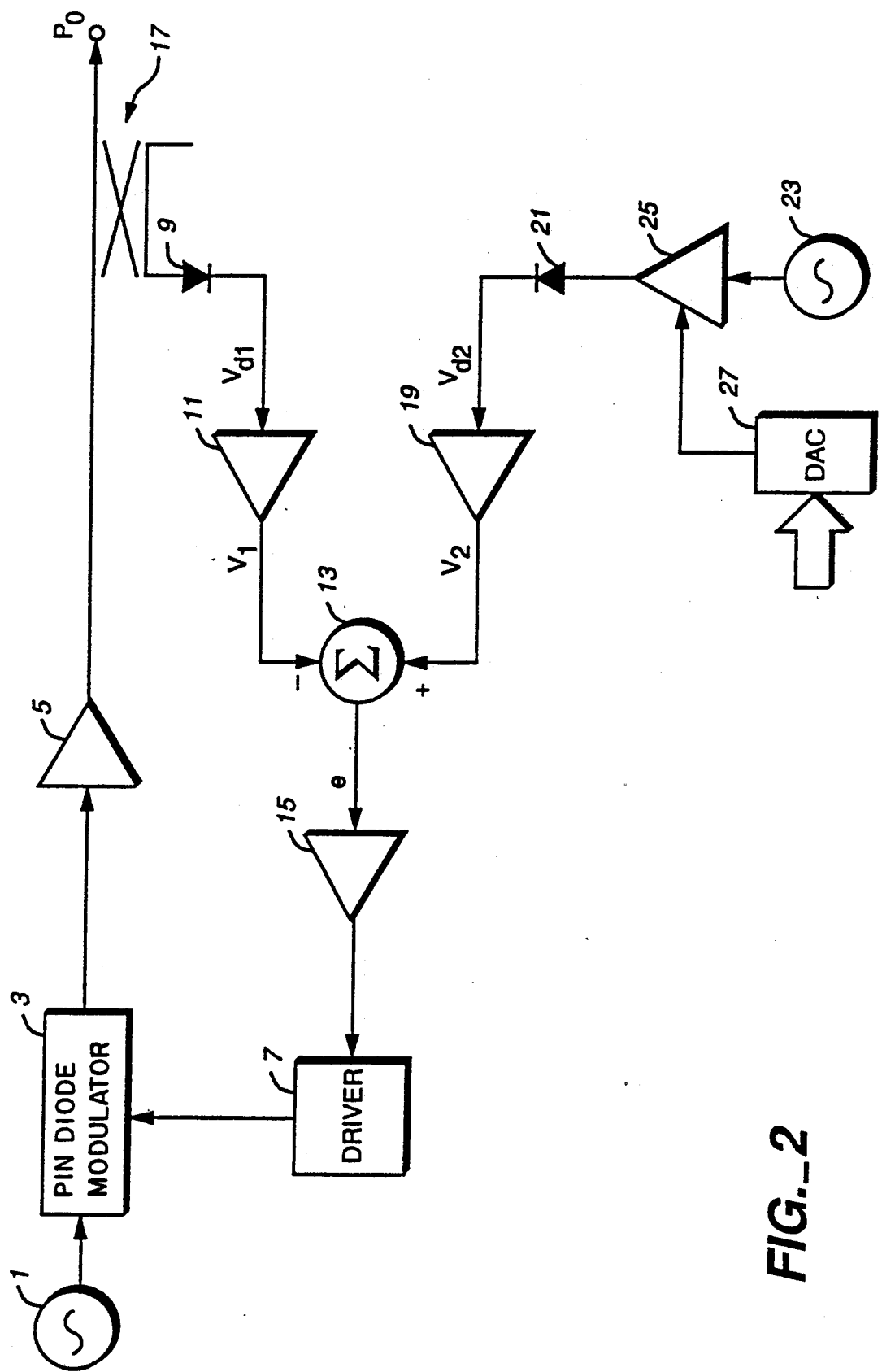
FIG._2

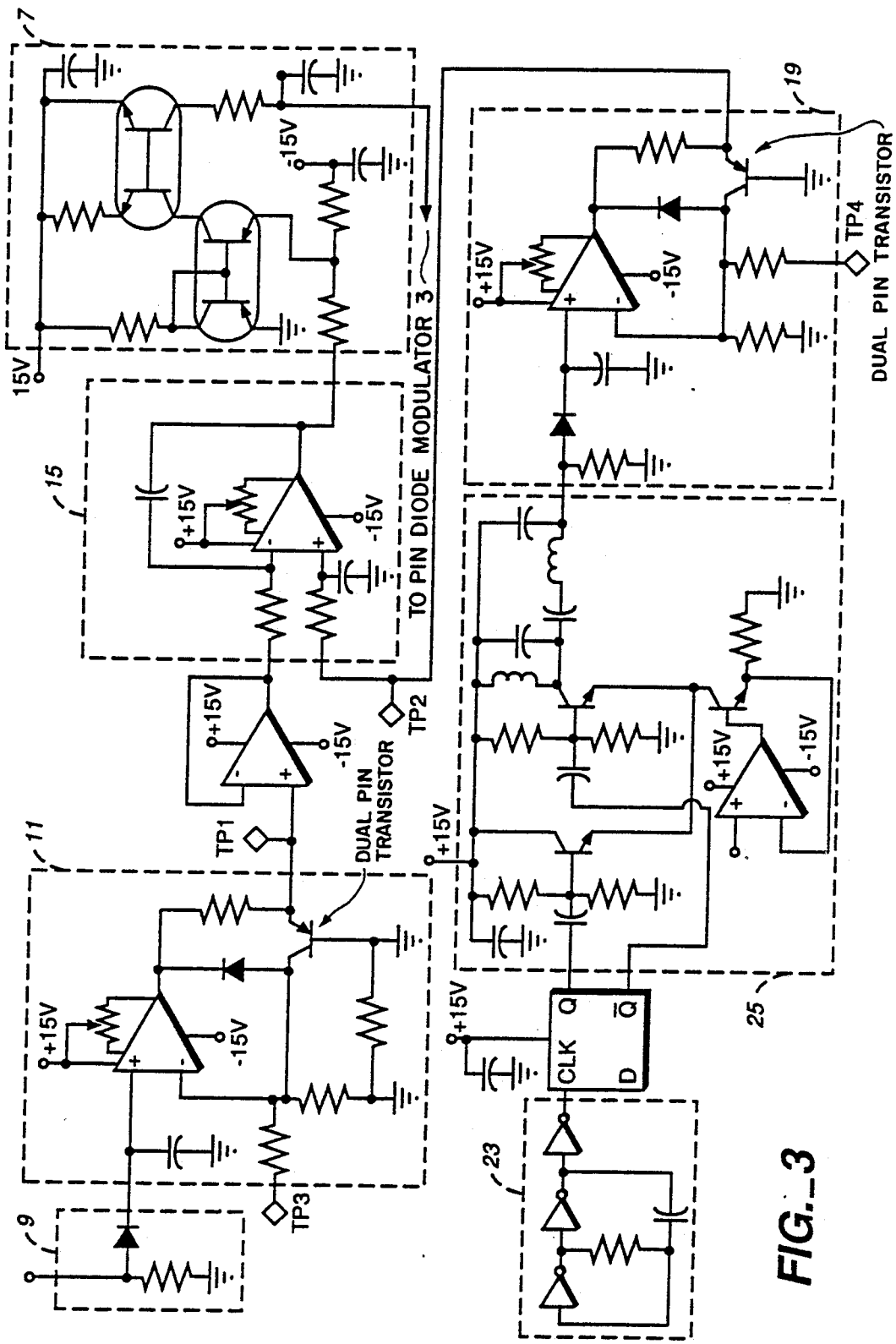
FIG._3

AUTOMATIC CONTROL SYSTEM

BACKGROUND OF THE INVENTION

1. Field of the Invention

The present invention generally relates to automatic control systems for controlling the output power of broadband signal generators and, more particularly, to automatic control systems that compensate for temperature sensitive components in broadband signal generators.

2. State of the Art:

In control systems for controlling the output power of broadband signal generators, such as microwave generators, the performance of various components in the systems can vary with output frequency, output power, and operating temperature. To reduce uncontrolled output power variations from such signal generators, it is known to employ negative feedback loops that incorporate logarithmic amplifiers. In practice, the logarithmic amplifiers usually are PN junctions which, by nature, have logarithmic behavior.

Although logarithmic amplifiers are effective in limiting microwave gain changes in the forward gain path in microwave signal generators, those amplifiers ordinarily do not compensate for temperature-related variations. Accordingly, it is common practice to augment feedback control loops with temperature-compensating thermistor networks.

Usage of temperature-compensating thermistor networks in microwave signal generators is not completely satisfactory, however, because such networks require painstaking determinations of detector temperature drift characteristics across the full range of operating frequencies, temperatures and power levels of the host signal generator. Specifically, temperature drift tests must be performed on a large sample of the temperature-sensitive components, such as microwave detectors, so that components temperature drift characteristics can be accurately determined. In practice, the tests usually are performed over the full temperature and frequency range of the microwave generator (e.g., 2 to 26 gigahertz, and 0 to 55° C.) and at different power levels (e.g., −10 to +10 dbm). Such testing not only consumes time but is expensive.

In view of the preceding discussion, it can be appreciated that a need exists for improved automatic power control systems that compensate for the performance of temperature-variable components in broadband signal generators.

SUMMARY OF THE INVENTION

The present invention provides an automatic power control system that compensates for temperature variable components in a broadband signal generator by providing a reference signal generating circuit that is temperature matched with an automatic level control feedback circuit. In the preferred embodiment, the temperature matched components are either monolithic or placed in substantial thermal contact with one another. The signals from the matched signal paths are input to a summing circuit such that the effect of any temperature variation in one path is exactly offset by the corresponding temperature variation in the other path.

In the preferred embodiment of an automatic power control system according to the present invention, the system comprises dual monolithic logarithmic amplifiers connected for logarithmically amplifying a reference level signal and the output signals of a signal generator, respectively; first and second detectors coupled to the inputs of respective ones of the dual logarithmic amplifiers for detecting the power levels of the signal generator and of the reference level signals, respectively; a summer connected to sum output signals from each of dual monolithic logarithmic amplifier means; and means responsive to output signals from the summing means for modulating the output of the signal generator to maintain constant output power. The dual logarithmic amplifiers can comprise, for instance, dual PNP transistors. Preferably, the first and second detectors are substantially identical and are in thermal contact with one another.

BRIEF DESCRIPTION OF THE DRAWINGS

The present invention can be further understood by reference to the following description and appended drawings which illustrate the preferred embodiments of the invention. For purposes of clarity, identical parts are given the same reference numbers in the various drawing figures. In the drawings:

FIG. 1 is a functional block diagram of an automatic level control (ALC) circuit according to the prior art;

FIG. 2 is a functional block diagram of an ALC circuit according to the present invention; and FIG. 3 is a schematic diagram of the feedback loop in the ALC circuit of FIG. 2.

DETAILED DESCRIPTION OF THE PREFERRED EMBODIMENT

FIG. 1 generally shows a microwave signal generator including an ALC feedback circuit according to the prior art. Such feedback circuitry is used, for example, in microwave signal generators produced by the Hewlett-Packard Company of Palo Alto, Calif. As will be described below, the ALC feedback circuit holds the output power of the microwave generator relatively constant regardless of microwave gain changes in the forward gain path. That is, the ALC feedback loop provides nearly constant loop-gain and bandwidth while assuring stability over large frequency ranges and power levels. Such performance is particularly important in microwave signal generators having, for example, a frequency range of from about two to about twenty six gigahertz (i.e., wideband generators).

In the feed forward path of the microwave signal generator of FIG. 1, the output of a microwave oscillator 1 is shaped and amplified by the series combination of a modulator 3 and an amplifier 5. Modulator 3 can comprise, for example, a simple shunt PIN diode modulator. In the illustrated embodiment, modulator 3 is driven by a conventional modulator driver 7 having inverse exponential characteristics. In practice, the combination of modulator 3 and driver 7 provides linear gain in terms of decibels per volt.

The feedback loop in the microwave signal generator in FIG. 1 is an example of a typical one of the above-discussed ALC feedback circuits. As such, the feedback loop includes a series combination of a diode microwave detector 9, a logarithmic amplifier 11, a summing junction 13, an integrator 15, and the above-discussed modulator driver 7. The diode detector 9 is coupled to the output of microwave amplifier 5 by a conventional leveling coupler 17.

In operation of the feedback loop in the microwave signal generator in FIG. 1, summing junction 13 forms the differential sum between the output of logarithmic amplifier 11 and a reference signal input. In the drawing, the output of the summing junction is designated by the letter "e" to indicate that it is an error signal. The remaining components in the feedback loop operate to drive the error signal to zero while providing sufficient closed-loop phase margin to ensure stability with respect to power and frequency variations.

To assure stability of the circuit of FIG. 1 for temperature variations, microwave detector 9 and logarithmic amplifier 11 must be temperature compensated. Since the temperature drift of those components usually varies with the output level of the system, temperature compensation cannot be performed using a single compensating network.

In practice, temperature compensation for the circuit of FIG. 1 is provided by a thermistor compensation network, not shown, that is incorporated into logarithmic amplifier 11. Practically speaking, the thermistor compensation network can only be designed for a particular power level, for example, −20 dbm, as measured at the input to diode detector 9. Thus, provision must be made for the remaining or "residual" temperature-induced drift at other power levels of the microwave signal generator. However, compensation for residual drift is complicated by the fact that microwave detector 9 usually has a nearly square-law response at lower power levels but a linear response at higher power levels.

The ALC circuit in FIG. 2 is designed to obviate the above-discussed difficulties. In the illustrated embodiment, the circuit includes many components that are common to the circuit of FIG. 1 and, additionally, includes a reference signal circuit comprised of a second logarithmic amplifier 19, a second diode detector 21, a second oscillator 23, a variable gain amplifier 25, and a digital-to-analog converter 27. It should be noted that the reference logarithmic amplifier 19 and diode detector 21 are substantially identical to their above-discussed counterparts. It should also be noted that the inputs of the respective diode detectors are AC signals but that the detectors outputs are DC voltages.

In practice, microwave oscillator 23 in the reference circuit in FIG. 2 is simply a one megahertz oscillator. Further in the circuit, the system microprocessor, not shown, is connected to control variable gain amplifier 25 via digital-to-analog converter 27. This allows the level of the reference signal to be selected as desired.

In the preferred embodiment of the ALC feedback circuit of FIG. 2, the two logarithmic amplifiers 11 and 19 are monolithic. Monolithic construction can be realized, for example, by employing a dual PNP transistor. Further in the preferred embodiment, diode detectors 9 and 21 are placed in thermal contact by a common heat sink. Alternatively, the diode detectors may be monolithic and the logarithmic amplifiers can be placed in thermal contact. As still another alternative, all four components can be monolithic in a dual hybrid package. The essential principal underlying such embodiments is that the two pairs of devices are essentially identical in their design, construction and operating conditions.

In operation, the ALC feedback circuit of FIG. 2 forces the output of logarithmic amplifier 11 to be equal to the output of reference logarithmic amplifier 19. Because the feedback signals and the reference signals are summed with different polarities at summing junction 13, thermal drift in one path is cancelled by identical thermal drift in the other path. In other words, both the logarithmic amplifiers 11 and 19, and the diode detectors 9 and 21, thermally track one another.

Operation of the ALC circuit of FIG. 2 can also be explained mathematically. When integrator 15 furnishes sufficiently high loop gain to force the error voltage, e, to zero, then $$e = V_1 - V_2 = 0.$$

Also, at that time:

$$V_1 = (kT_1/q)ln(V_{d1}/R_1 * I_{s1})$$

$$V_2 = (kT_2/q)ln(V_{d2}/R_2 * I_{s2}).$$

In the preceding expressions, k is Boltzman's constant, and $T_1$ and $T_2$ are the temperatures (degrees Kelvin) of the two logarithmic amplifiers 11 and 19, respectively. Also in the expressions, q is electric charge, and $I_{s1}$ and $I_{s2}$ are the saturation currents of each logarithmic amplifiers 11 and 19, respectively. Similarly, $R_1$ and $R_2$ are the resistances of the respective ones of the logarithmic amplifiers. Therefore, when the error voltage is zero:

$$(kT_1/q)ln(V_{d1}/R_1 * I_{s1}) - (kT_2/q)ln(V_{d2}/R_2 * I_{s2}) = 0.$$

Because the logarithmic amplifiers 11 and 19 are monolithic, $$T_1 = T_2, \text{ and}$$

$$I_{s1} = I_{s2}.$$

By choosing the same resistance value, R, for each of the logarithmic amplifiers, $$(kT/q)ln\{(V_{d1}/R * I_s)(R * I_s/V_{d2})\} = 0$$

and, therefore, $$(kT/q)ln(V_{d1}/V_{d2}) = 0.$$

It should be noted that the preceding equations can only be satisfied if $V_{d1}$ equals $V_{d2}$. Thus, when the two detectors 9 and 21 have identical characteristics and are at the same temperature, their output voltages and, hence, their respective power inputs will be equal independent of temperature, power level, and the transition from square-law to linear operation. The power level may be accurately controlled to any desired resolution by means of the system microprocessor and the digital-to-analog converter 27.

In practice, the other components in the feedback and reference signal paths in the circuit of FIG. 2 exhibit relatively little temperature drift as compared to the logarithmic amplifiers 11 and 19, and diode detectors 9 and 21. The principal active element among the remaining components is summing junction 13. As shown in FIG. 3, the summing junction is usually comprised of a conventional operational amplifier.

Operational amplifiers such as the one shown in FIG. 3 usually have temperature drift of approximately 0.3 $\mu v/°C$. and an offset voltage of about 25 $\mu v$. Both values are substantially less than corresponding values for the above-discussed detectors under normal operating conditions. Similarly, the reference oscillator and the variable gain amplifier in FIG. 3 exhibit negligibly low temperature coefficients.

In comparison to the prior art, the ALC feedback system of FIG. 2 is simple and low-cost but provides high performance. By identically constituting the most drift-prone portions of the feedback and reference signal paths such that their temperature drifts cancel one another, compensation is more nearly ideal than that achievable using one or more compensation networks. Moreover, exhaustive characterization of diode detectors is not required. Nor does provision need to be made for transitions in detector operation from the square-law to linear regions. Finally, components in the feedback and reference signal paths may also be freely exchanged during manufacture so long as the components are matched.

The foregoing has described the principles, preferred embodiments and modes of operation of the present invention. However, the present invention should not be construed as being limited to the particular embodiments discussed. Instead, the above-described embodiments should be regarded only as illustrative, and it should be appreciated that workers skilled in the art may make variations in those embodiments without departing from the spirit or scope of the present invention as defined by the following claims.

What is claimed is:

1. An automatic control system for controlling the output power level of a signal generator across a wide range of temperatures, comprising:
   dual monolithic logarithmic amplifier means connected for logarithmically amplifying reference level signals and the output signals of a signal generator, respectively;
   first and second detector means coupled to respective ones of the dual logarithmic amplifier means for detecting the power level of the signal generator and of the reference level signals, respectively, with the first and second detectors being of substantially identical design and construction and, further, being in thermal contact with one another;
   summing means connected to sum output signals from each of the dual monolithic logarithmic amplifier means; and
   modulating means responsive to output signals from the summing means for modulating the output of the signal generator to maintain constant output power.

2. The automatic control system of claim 1 further comprising a reference oscillator for exciting said second detector means, which reference oscillator has fixed frequency.

3. The automatic control system of claim 2 further including a variable gain amplifier for amplifying output signals from the reference oscillator.

4. The automatic control system of claim 3 wherein the dual logarithmic amplifier means comprises a dual PNP transistor.

5. The automatic control system of claim 4 wherein the modulating means comprises a shunt PIN diode modulator.

6. The automatic control system of claim 1 wherein the dual logarithmic amplifier means comprises a dual PNP transistor.

7. The automatic control system of claim 1 wherein the modulating means comprises a shunt PIN diode modulator.

8. An automatic control system for controlling the output power level of a signal generator across a wide range of temperatures, comprising:
   dual monolithic logarithmic amplifier means connected for logarithmically amplifying a reference level signal and the output signals of a signal generator, respectively;
   first and second detector means coupled to the inputs of respective ones of the dual logarithmic amplifier means for detecting the power levels of the signal generator and of the reference level signals, respectively, the first and second detectors being substantially identical and in thermal contact with one another;
   summing means connected to sum output signals from each of the dual monolithic logarithmic amplifier means; and
   modulating means responsive to output signals from the summing means for modulating the output of the signal generator to maintain constant output power.

9. The automatic control system of claim 8 wherein the dual logarithmic amplifier means comprise dual PNP transistors.

* * * * *